(12) United States Patent
Hannebauer

(10) Patent No.: US 8,847,160 B2
(45) Date of Patent: Sep. 30, 2014

(54) SEMICONDUCTOR FOR SENSING INFRARED RADIATION AND METHOD THEREOF

(75) Inventor: Robert Hannebauer, Vancouver (CA)

(73) Assignees: Hanvision Co., Ltd. (KR); Lumiense Photonics Inc. (CA)

( * ) Notice: Subject to any disclaimer, the term of this patent is extended or adjusted under 35 U.S.C. 154(b) by 178 days.

(21) Appl. No.: 13/251,674

(22) Filed: Oct. 3, 2011

(65) Prior Publication Data

US 2012/0061572 A1 Mar. 15, 2012

Related U.S. Application Data

(63) Continuation-in-part of application No. 12/270,418, filed on Nov. 13, 2008, now Pat. No. 8,039,797.

(51) Int. Cl.
*G01J 5/24* (2006.01)
*H01L 27/14* (2006.01)
*H01L 31/09* (2006.01)
*H04N 5/33* (2006.01)
*H01L 31/18* (2006.01)
*H01L 27/146* (2006.01)

(52) U.S. Cl.
CPC ............ *H01L 31/09* (2013.01); *H01L 27/14649* (2013.01); *H04N 5/33* (2013.01); *H01L 27/14669* (2013.01); *H01L 31/18* (2013.01); *G01J 5/24* (2013.01)
USPC ........................................ 250/338.1; 257/443

(58) Field of Classification Search
CPC .................... G01N 21/274; G01N 2021/1772; G01J 5/24
USPC ...................................................... 250/338.1
See application file for complete search history.

(56) References Cited

U.S. PATENT DOCUMENTS 5,486,698 A * 1/1996 Hanson et al. ................. 250/332
5,656,816 A    8/1997 Tanaka
6,133,572 A * 10/2000 Cunningham ........... 250/339.03

(Continued)

FOREIGN PATENT DOCUMENTS

WO    2007032632 A1    3/2007

OTHER PUBLICATIONS

Hwang et al. "Pixel Readout Circuit with Current Mirroring Injection for Microbolometer FPAs." Electronics Letters (44) 12; pp. 1-2.
Tanaka et al. (2003). "Performance of 320×240 Uncooled Bolometer-type Infrared Focal Plane Arrays." Proc. SPIE vol. 5074, pp. 414-424.

*Primary Examiner* — Casey Bryant
(74) *Attorney, Agent, or Firm* — Cantor Colburn LLP

(57) ABSTRACT

The bolometric sensing circuit includes a pixel array comprising pixels, each pixel comprising a sensor configuration to comprise a light receiving portion to convert incident photons into heat and a sensing portion integrated with the light receiving portion and having a resistance varying according to the converted heat; an output portion to output a common mode voltage that represents a voltage of the sensing portion from which accumulated heat has been removed in response to a heat removing voltage to thermally reset the sensing portion, and output a sensed voltage that represents a voltage of the sensing portion which has accumulated heat for an integration period after being thermally reset; and a processor to subtract the common mode voltage from the sensed voltage to produce a signal voltage that represents a change in resistance of the sensing portion due to the heat accumulated for the integration period.

5 Claims, 14 Drawing Sheets

(56) References Cited

U.S. PATENT DOCUMENTS

| | | | |
|---|---|---|---|
| 8,039,797 B2* | 10/2011 | Hannebauer | 250/338.1 |
| 8,525,393 B1* | 9/2013 | Grbovic et al. | 310/339 |
| 2001/0025926 A1* | 10/2001 | Mashio et al. | 250/338.4 |
| 2002/0040967 A1 | 4/2002 | Oda | |
| 2007/0145274 A1* | 6/2007 | Iida | 250/338.4 |
| 2009/0008556 A1* | 1/2009 | Dupont et al. | 250/338.1 |
| 2009/0152470 A1 | 6/2009 | Dupont et al. | |
| 2010/0038540 A1 | 2/2010 | Hannebauer | |

* cited by examiner

SEMICONDUCTOR FOR SENSING INFRARED RADIATION AND METHOD THEREOF

CROSS REFERENCE TO RELATED APPLICATIONS

This application is a continuation-in-part of U.S. application Ser. No. 12/270,418, filed on Nov. 13, 2008, and all the benefits accruing therefrom under 35 U.S.C. §120, the contents of which are herein incorporated by reference in their entirety.

TECHNICAL FIELD

The following description relates to a semiconductor device and a method of fabricating to the same.

BACKGROUND

Various methods have been employed to implement devices for sensing infrared radiation. Among infrared sensors, microbolometer infrared sensors are notable, because of the method used to sense infrared rays; by measuring an electric signal that changes according to temperature differences caused by absorbed heat from infrared rays.

Typically, a non-cooled infrared sensor such as a microbolometer includes a light receiving portion and a detecting portion. The light receiving portion converts energy of photons into heat, and the detecting portion detects electric signals, such as resistance, capacitance, and pyroelectric effect, which change according to the temperature caused by the heat converted by the light receiving portion.

The conventional infrared sensors, especially, a resistive sensor includes a resistive detecting element which may be vanadium oxide (VOx), poly-silicon, amorphous-silicon, thermistor $(MnNiCO)_3O_4$ or a diode. VOx has an advantageously good resistance change rate to temperature change, whereas it has a fatal disadvantage that the flicker noise is excessively large. Thus, the conventional resistive infrared sensor using such material as the resistive detecting element, has system performance that drastically deteriorates (especially at a low frequency where the influence of flicker noise substantially increases). To solve the problem such as the flicker noise, titanium with a very small flicker noise has been used for the resistive detecting element. However, since material such as titanium has a too small resistance change rate to temperature change, it is not suitable for the detecting element of the infrared sensor.

Furthermore, according to the conventional art, sometimes a mechanical chopper is externally provided to the infrared sensor to improve the sensor's performance in sensing infrared radiation. This is used principally for ferroelecric devices and sometimes (but not necessarily) for microbolometers. The mechanical chopper periodically cuts off photons to maintain a detecting element below a reference temperature. The mechanical chopper, when used, greatly increases the complexity of an infrared detecting system. That is, the mechanical chopper complicates the assembly processes of the infrared sensing system, increases the manufacturing cost, and causes various limitations in operation.

Moreover, the semiconductor device includes a detecting element that outputs electric current, and the output electric current responding to light has a significantly weak intensity. Since the magnitude of a common mode current which is output in dark conditions is significantly large and the common mode current itself changes according to temperature, it is difficult to accurately measure a sensing current output from a sensor.

Furthermore, according to the conventional art, all non-cooled thermal imaging detectors suffer from image lag, where in image lag is the remaining parts of one frame of a video still being present in the current frame of video. This effect manifests itself as a smearing and ghosting.

SUMMARY

In one aspect, there is provided a bolometric sensing circuit including: a pixel array comprising a plurality of a pixel, each pixel comprising a sensor configuration configured to comprise a light receiving portion to convert incident photons into heat and a sensing portion integrated with the light receiving portion and having a resistance varying according to the converted heat; an output portion configured to output a common mode voltage that represents a voltage of the sensing portion from which accumulated heat has been removed in response to a heat removing voltage to thermally reset the sensing portion, and output a sensed voltage that represents a voltage of the sensing portion which has accumulated heat for an integration period after being thermally reset; a memory configured to store the common mode voltage and the sensed voltage; and a processor configured to subtract the common mode voltage from the sensed voltage to produce a signal voltage that represents a change in resistance of the sensing portion due to the heat accumulated for the integration period.

One scan period consumed to output the common mode voltage and the sensed voltage may include a first period before the common mode voltage is read out and a second period after is the common mode voltage has been read out, and the output portion may be further configured to comprise a storage configured to store the common mode voltage for the first period and store the sensed voltage for the second period; and a switching portion configured to output the common mode voltage to the memory after the first period and subsequently output the sensed voltage after the second period.

The output portion may be further configured to comprise a first storage configured to store the common mode voltage, a second storage configured to store the sensed voltage, a first switching portion configured to output the common mode voltage to the memory and a second switching portion configured to output the sensed voltage to the memory.

The output portion may be further configured to comprise a first storage configured to store the common mode voltage, a second storage configured to store the sensed voltage, a third storage configured to store a common mode voltage or a sensed voltage of an temporal adjacent frame of a current frame, a first switching portion configured to output the common mode voltage to the memory, a second switching portion configured to output the sensed voltage to the memory and a third switching portion configured to output the common mode or sensed voltage present in the third storage.

The sensing portion may be a single-crystalline silicon thin film.

The processor may supply a control signal to the switching portion for control.

In another aspect, there is provided a semiconductor device including: a sensor configuration comprising a light receiving portion for converting incident photons into heat and a sensing portion integrated with the light receiving portion and having a resistance varying according to the converted heat; and a sensing circuit configured to comprise a common mode current providing portion and a current subtraction portion, wherein the common mode current providing portion outputs a globally referenced current related to a value of the current which is flowing in the sensing portion when there is no incident light and the current subtraction portion is outputs subtraction currents for the common mode current and a sensing current related to a current output from the sensing portion, wherein the globally referenced current is distributed to every pixel of the pixel array comprising the semiconductor device.

Other features will become apparent to those skilled in the art from the following detailed description, which, taken in conjunction with the attached drawings, discloses exemplary embodiments of the invention.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions are omitted to increase clarity and conciseness.

Figure 1A:
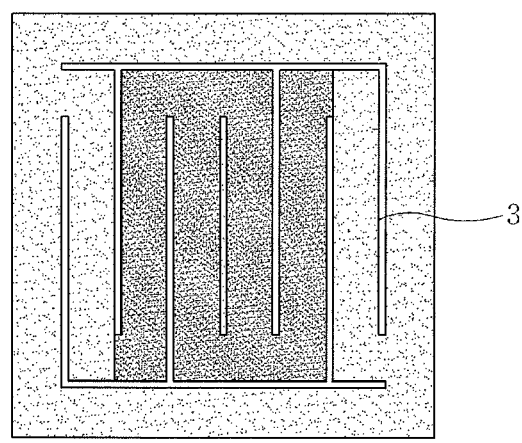
FIG. 1A is a top view of a semiconductor device according to an exemplary embodiment.
Figure 1B:
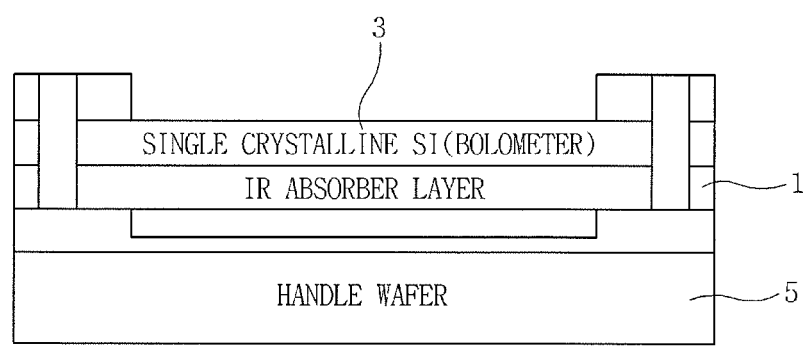
FIG. 1B is a front view of the semiconductor device in FIG. 1B.

FIG. 1A is a top view of a semiconductor device according to an exemplary embodiment, and FIG. 1B is a front view of the semiconductor device in FIG. 1B. The semiconductor device includes a light receiving portion 1, a sensing portion 3, and a handle wafer 5. The light receiving portion 1 may be formed of multiple layers of various materials such as SiO and $Si_3N_4$, which are compatible with CMOS fabrication processes, to convert energy of incident photons into heat.

According to an exemplary embodiment, single crystalline silicon is used for the sensing portion 3, which is a resistive sensing element, by the use of a thin-film transfer technology. The single crystalline silicon has a temperature coefficient of resistance (TCR) of about 0.2%/° K, which is smaller than TCR of 2 to 3%/° K of, for example, vanadium oxide (VOx), poly-silicon, amorphous-silicon, thermistor ($(MnNiCO)_3O_4$), and a diode. Thus, the single crystalline silicon has a small resistance change rate to the temperature change. However, since the single crystalline silicon has mainly Johnson noise which can be calculated by Equation 1 below whereas the poly-silicon or amorphous-silicon has mainly flicker noise, the single crystalline silicon may have a substantially small amount of noise.

$$v_n = \sqrt{4KTBR} \quad \text{Equation 1}$$

Here, Vn represents Johnson noise, K denotes Boltzmann constant, B denotes a frequency band, and R represents resistance.

The sensing portion 3 in accordance with the exemplary embodiment has its resistance maximized such that signal-to-noise ratio (SNR) is maximized to dramatically enhance the performance of the semiconductor device.

The reasons for maximizing the resistance are as follows:

First, with reference to Equation 2 below, it can be understood that the resistance needs to be maximized since the current should be reduced in order to maximize the amplitude of a signal with respect to the heat increase caused by the self-bias of the sensing portion 3.

$$S/P = \frac{TCR \cdot \Delta T}{i} \quad \text{Equation 2}$$

Here, S represents the amplitude of a signal, P represents power of the self-bias, TCR stands for temperature coefficient of resistance, $\Delta T$ represents a temperature variation, and i is denotes electric current.

Second, with reference to Equation 3 below, to increase SNR, the resistance is required to be maximized.

$$SNR = \frac{(i \cdot (TCR) \cdot \Delta T \cdot \sqrt{R})}{\sqrt{4KTB}} \quad \text{Equation 3}$$

Here, SNR stands for "signal-to-noise ratio", i denotes electric current, TCR stands for "temperature coefficient of resistance", $\Delta T$ represents a temperature variation, R denotes resistance, K denotes Boltzmann constant, T represents temperature, and B represents a frequency band.

According to the exemplary embodiment, there are two ways of maximizing the resistance in the sensing portion 3 which is a resistive sensor.

First, as shown in FIG. 1A, the sensing portion 3 is formed in a serpentine structure with narrow width and curved shape on a single crystalline Si layer, so that the resistance can be increased. According to another exemplary embodiment, the light receiving portion 1 may have a typical shape such as a rectangle to maximize the heat conversion efficiency. To make the sensing portion 3 protrude to an external surface, the sensing portion 3 is patterned first and subsequently the following process such as laminating the light receiving portion 1 is carried out. Second, coefficient of thermal expansion (CTE) of the single crystalline silicon of the sensing portion 3 is $2.6*10^{-6}$ and CTE of nitride ($Si_3N_4$) which forms the light receiving portion 1 is $3.3*10^{-6}$. Thus, nitride ($Si_3N_4$) or dielectric layer formed of multiple layers applies thermal stress to the single crystalline silicon, which has piezoresistance that is changed by the stress, so that the resistance of the sensing portion 3 can be increased. For this reason, the sensing portion 3 can have an effect that the resistance has changed greater than the TCR. Resistance of a silicon substrate varies according to a density of impurities in the silicon substrate, and the additional change in the resistance can be achieved by adjusting a doping level of a single crystalline silicon thin film.

Referring to FIGS. 1A and 1B, the semiconductor device in accordance with the exemplary embodiment is implemented in a micro electro mechanical system (MEMS) structure. Accordingly, the semiconductor device in the MEMS structure can be thermally reset with efficiency even without a mechanical chopper, and the MEMS structure realizes high-speed operation of the semiconductor device by allowing the performance of the sensing portion to be independent to its sensitivity.

A thin-film transfer technology will be described with reference to FIGS. 2 to 6, and the MEMS structure will be described in detail with reference to FIGS. 7 to 9.

FIGS. 2 to 6 schematically show procedures of the thin-film transfer in accordance with an exemplary embodiment.

Figure 2:
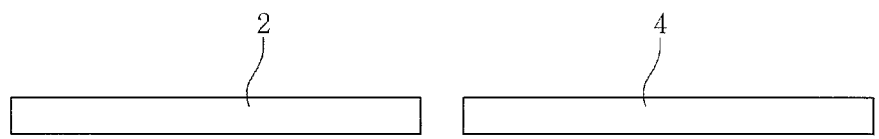
FIGS. 2 to 6 schematically show procedures of thin-film transfer according to an exemplary embodiment.

Referring to FIGS. 2 to 6, as shown in FIG. 2, a handle wafer 2 is placed on the left and a donor wafer 4 is on the right. Both the handle wafer 2 and the donor wafer 4 are covered with thermal oxide (not shown).

Figure 3:
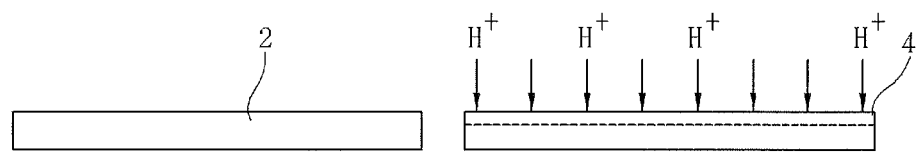
Figure 4:
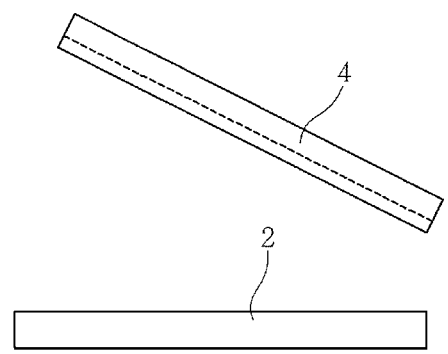
Figure 5:
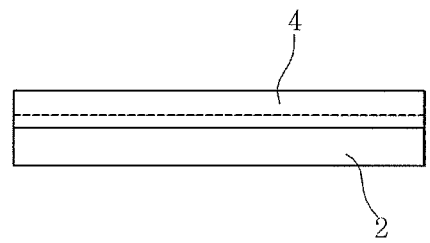

On the donor wafer 4, as shown in FIG. 3, hydrogen (H+) is implanted to a certain depth. The implanted hydrogen weakens the connection force of the donor wafer 4 at a particular depth. Especially, when the concentration of hydrogen exceeds solid solubility in silicon, a large amount of hydrogen functions as a partition in the course of wafer cutting. Then, as shown in FIG. 4, the donor wafer 4 covers the handle wafer 2. At this time, the surface of the donor wafer 4 on which the hydrogen implanting has been performed is disposed to touch the handle wafer 2. Consequently, as shown in FIG. 5, the donor wafer 4 and the handle wafer 2 are bonded to each other. Although not shown in drawings, plasma may be used to accelerate the bonding process.

Once the two wafers have contacted to each other, the boding between the wafers is started by applying point-pressure to each surface of the wafers at room temperature. When the bonding of wafers is complete, a strong bonding force, which corresponds to 80% of a common bonding force, is provided between the wafers through annealing process, this occurs later in the process. The wafers according to the exemplary embodiment can also be naturally annealed by utilizing heat created in the course of transistor fabrication process. In this case, loss of doping material caused by diffusion during the implanting process can be minimized.

Figure 6:
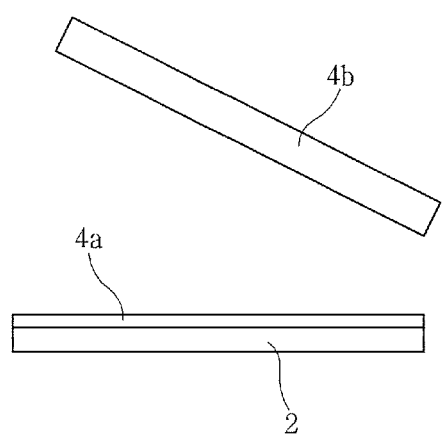

When the bonding of the wafers is complete, the bonded wafers undergo a thermal process. By the thermal process, hydrogen ions in silicon of the donor wafer 4 gather together, and the donor wafer 4 is divided into two portions 4a and 4b, as shown in FIG. 6, as the donor wafer 4 is cut off along a crystalline surface. A portion 4b of the donor wafer 4 can be reused several times by polishing, forming a silicon-oxide layer thereon and cleaning it.

In the exemplary embodiment, the thin-film transfer employs the Smart Cut process by which the hydrogen ions are implanted into the donor wafer 4. However, the SiGen's NanoCleave™ process can be employed for the thin-film transfer of the present exemplary embodiment. In the Nano-Cleave™ process, a silicon layer and a SiGe layer are formed on a donor wafer to transfer the thin film. In this case, a thin-film is formed with a Si-EPI deposition method instead of thermal oxide layer formation and hydrogen implanting process such that only the silicon layer is bonded and transferred at room temperature. A low-cost silicon-on-insulator (SOI) process such as SIMOX enables realization of an inexpensive sensor.

Figure 7:
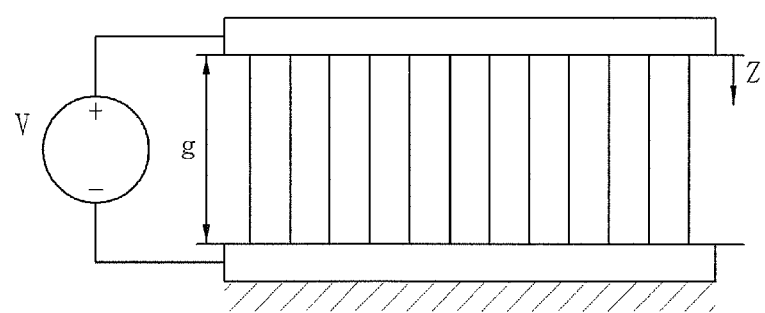
FIG. 7 is an illustration for explaining an MEMS structure according to an exemplary embodiment.

FIG. 7 is an illustration for explaining an MEMS structure according to an exemplary embodiment. Referring to FIG. 7, the MEMS structure employed to the semiconductor device in accordance with the present invention is an electrostatic configuration. In the electrostatic configuration, electrostatic attraction force is generated at both ends of a parallel plate capacitor by applying an electric potential difference between the ends. The electrostatic attraction force can be calculated by Equation 4 below.

$$F = \frac{1}{2} \times \frac{\varepsilon A V^2}{(g-z)^2} \qquad \text{Equation 4}$$

Here, F represents electrostatic attraction force, $\in$ denotes dielectric constant, A represents the width of a capacitor, V denotes the electric potential difference, and (g–z) represents a distance between the ends.

Figure 8:
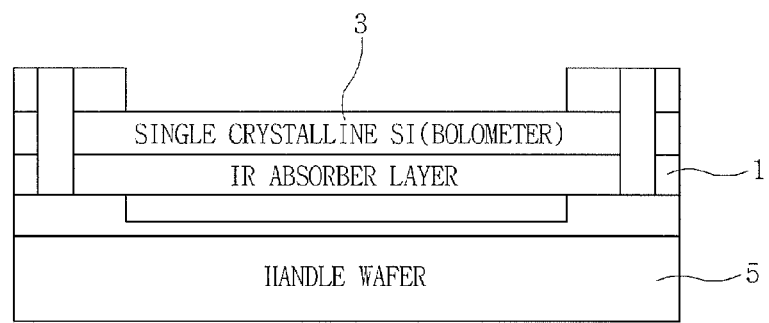
FIG. 8 is a front view of a semiconductor device during a sensing period according to an exemplary embodiment.
Figure 9:
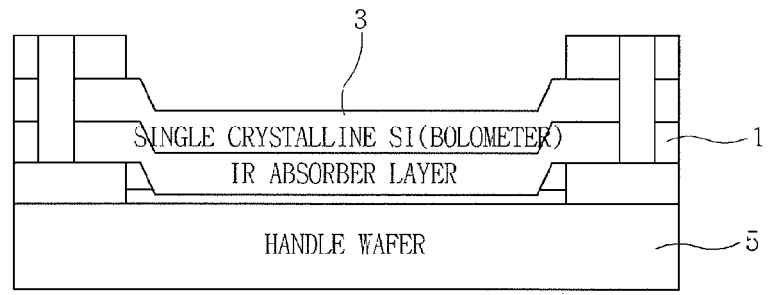
FIG. 9 is a front view of the semiconductor device during an accumulated heat reset period according to an exemplary embodiment.

FIG. 8 is a front view of a semiconductor device during a sensing period according to an exemplary embodiment, and FIG. 9 is a front view of the semiconductor device during an accumulated heat reset period according to an exemplary embodiment.

Referring to FIGS. 8 and 9, during the sensing period, a light receiving portion 1 of the semiconductor device converts energies of photons incident into heat, a sensing portion 3 changes a resistance value according to a change of converted heat. The heat converted from the energies of photons is accumulated during the sensing period. In order to improve the performance of the semiconductor device, the accumulated heat is reset in the MEMS-based reset structure, so that pixel reset can be effectively performed.

That is, when an electric potential difference is applied between a handle wafer 5 which is an heat removing portion and the sensing portion 3, electrostatic attraction force is generated between the light receiving portion 1, the sensing portion 3, and the handle wafer 5, and by the generated electrostatic attraction force, parts of respective IR absorber layer 1 and sensing portion 3 elastically deflect to be closer to the handle wafer 5. A space between the deflecting parts of the light receiving portion 1 and the sensing portion 3 and the handle wafer 5 is empty, from which $SiO_2$ is removed by wet etching. While the parts of the light receiving portion 1 and the sensing portion 3 elastically deflect to contact the handle wafer 5 (an accumulated heat reset period), the heat accumulated on the light receiving portion 1 and the sensing portion 3 is transferred to the handle wafer 5, thereby being reset.

Subsequently, when an applied voltage is released, the parts of the light receiving portion 1 and the sensing portion 3 which are contacting the handle wafer 5 are restored to the original state as shown in FIG. 8 by the elastic energy stored in the deflecting parts.

Although, for convenience of explanation, the handle wafer 1 functions as the heat removing portion according to the exemplary embodiment, any other element can be the heat removing portion as long as it has a configuration (including a multi-layered configuration) in which the heat accumulated on the light receiving portion 1 and the sensing portion 3 can be transferred to the element that is disposed near the light receiving portion 1 and the sensing portion 3, parts of which elastically deflect by electrostatic attraction force generated by an electric potential difference applied to the element and the light receiving portion 1 and the sensing portion 3.

According to the exemplary embodiment, the sensing portion 3, for which single crystalline silicon is employed by the use of the thin-film transfer method, enables effective elastic deflection and restoration in the MEMS-based reset structure, and thereby dramatically improving the performance and lifetime of the semiconductor device. If conventional polysilicon or amorphous-silicon is employed for the MEMS-based reset structure, the elastic transformation and restoration does not properly take place, and hence the desired performance and lifetime cannot be achieved. Since the semiconductor device in accordance with the exemplary embodiment has a MEMS-based reset structure, transistors can be disposed at a lower part of each of the light receiving portion 1 and the sensing portion 3, so that an additional horizontal space is not required.

According to another exemplary embodiment, to enhance the performance of the semiconductor device, in addition to the MEMS-based reset structure, a Peltier cooler may be added to the semiconductor device to provide more stable reference temperature.

Figure 10:
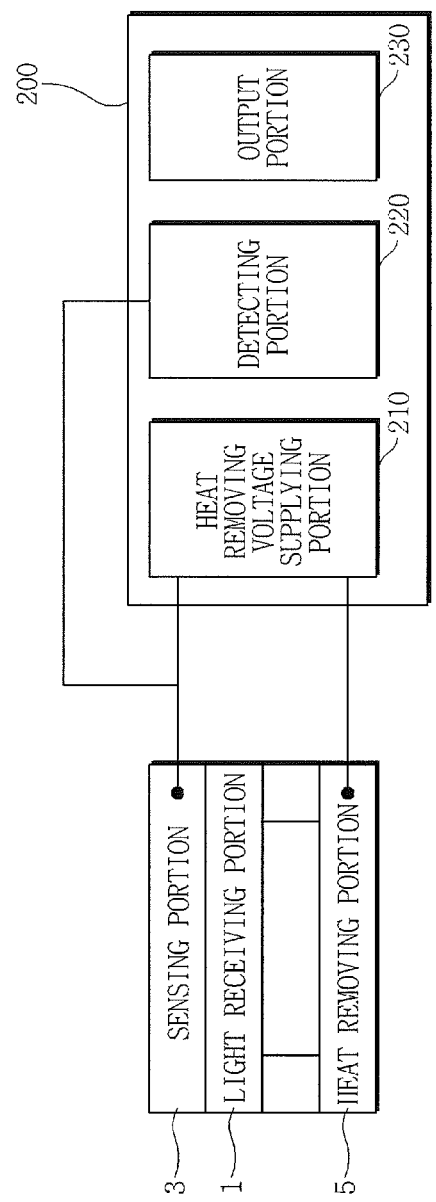
FIG. 10 is a block diagram of a semiconductor device including a sensing structure portion and a sensing circuit according to an exemplary embodiment.

FIG. 10 is a block diagram of a semiconductor device including a sensing structure portion and a sensing circuit according to an exemplary embodiment.

Referring to FIG. 10, the semiconductor device includes a sensor configuration 100 and a sensing circuit 200. The sensor configuration 100 includes a light receiving portion 1, a sensing portion 3, and a heat removing portion 5, for example, a handle wafer. The sensing circuit 200 applies an electric potential difference between the heat removing portion 5 and the sensing portion 3 to reset the heat accumulated in the light receiving portion 1 and the sensing portion 3 and detects the voltage change due to the accumulated heat. Although the sensing circuit 200 is illustrated as a block separated from the sensor configuration 100, it may be disposed on an SOI thin-film layer for the transistor formation on the same semiconductor wafer as the sensor configuration 100.

The sensing circuit 200 includes a heat removing voltage supplying portion 210, a detecting portion 220, and an output portion 230. The heat removing voltage supplying portion 210 applies voltage having a higher electric potential to the heat removing portion 5 than to the sensing portion 3 in order that the heat accumulated in the light receiving portion 1 and the sensing portion 3 is reset. As described above, the electric potential difference is possible to be applied to both the light receiving portion 1 and the sensing portion 3 as long as the light receiving portion 1 and the sensing portion 3 can contact the heat removing portion 5 by the electrostatic attraction force to dump the accumulated heat to the heat removing portion 5.

The heat removing voltage supplying portion 210 applies an electric potential difference between the heat removing portion 5 and the sensing portion 3 such that the light receiving portion 1 and the sensing portion 3 elastically deflect by an electrostatic attraction force to contact the heat removing portion 5. The heat removing voltage supplying portion 210 applies a voltage of, for example, about 0 volt to the sensing portion 3 and a voltage of about 4 volts to the heat removing portion 5 to reset the accumulated heat.

The sensing portion 3 has its resistance changed according to the heat converted by the light receiving portion 1, and may be formed of a single crystalline silicon film by an SOI substrate fabrication method.

The detecting portion 220 is connected with the sensing portion 3 to detect a quantity of change in resistance. Bolometric sensing requires that the received IR radiation causes a parametric shift in a resistance characteristic. This means that the temperature signal is a small signal on top of a large common mode signal. For example, with a TCR of 1%/C, a resistor of 1 MΩ will change by 10 kΩ for every degree of temperature. To detect to the 10 mK level, 100Ω difference must be detected on a common mode signal of 1 MΩ.

The output portion 230 outputs a voltage value corresponding to the quantity of change in resistance. The output portion 230 can be implemented as a complementary metal-oxide semiconductor (CMOS) image sensor (CIS) scan circuit which detects a voltage value corresponding to the detected infrared.

Figure 11A:
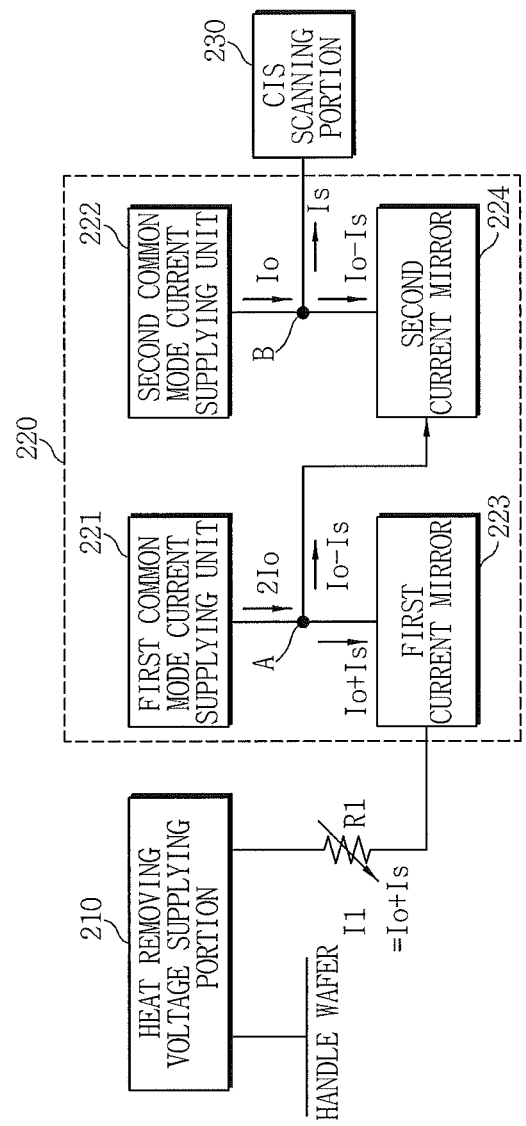
FIGS. 11A and 11B are block diagrams schematically showing a pixel circuit of an infrared sensor according to an exemplary embodiment.
Figure 11B:
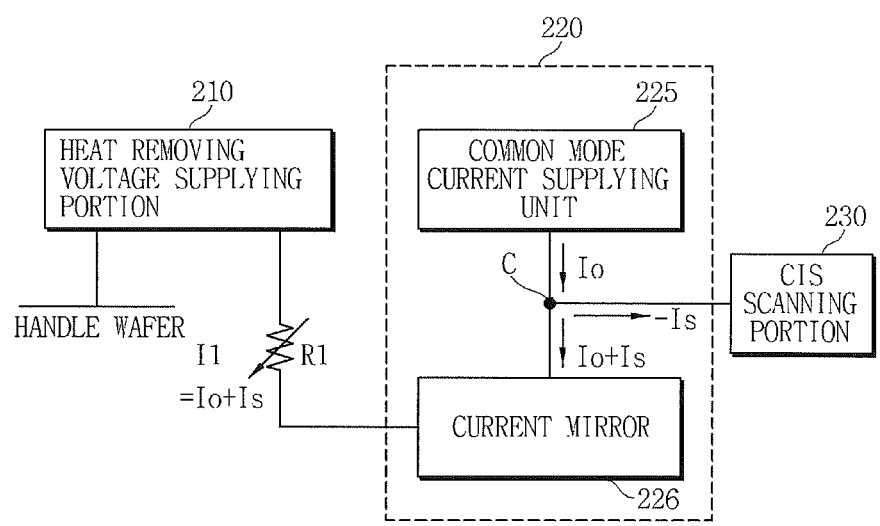

FIGS. 11A and 11B are block diagrams schematically showing a pixel circuit of an infrared sensor according to an exemplary embodiment. In FIGS. 11A and 11B, the sensing portion 3 is illustrated as a variable resistor R1, and the output portion 230 in FIG. 10 is illustrated as a CIS scanning portion 230.

The current flowing in the sensing portion R1 includes a large common mode current, which is caused by the large common mode resistance that is the initial resistance before the applying of the infrared, and a signal current caused by the resistance changes according to the absorbed thermal energy.

The electric current flowing in the sensing portion R1 is represented by Equation 5 below.

$$I1=(V\text{pix}-V_{DS})/R1 \qquad \text{Equation 5}$$

Here, Vpix represents a voltage applied to one end of the sensing portion R1, $V_{DS}$ represents a drain source voltage of a transistor N1 (referring to FIG. 12), and R1 represents a resistance value of the sensing portion 3. The resistance value R1 can be represented by, for example, 100 kΩ+ΔR. ΔR represents a resistance value that changes according to temperature change.

Therefore, if the current I1 is 10 at a certain temperature T1, the current I1 can be Io (common mode current)+Is (signal current by ΔR) at another temperature.

As shown in FIGS. 11A and 11B, the detecting portion 220 provides a common mode current Io which flows at a state before the input of photons, that is, when the resistance of the sensing portion R1 is the initial resistance, and outputs information according to the changed resistance of the sensing portion R1 by subtracting the current, which flows in the sensing portion R1 when the resistance of the sensing portion R1 changes after the input of photons, from the common mode current Io. Since a semiconductor device has its characteristics determined according to the size of the device or the degree of doping, it is easy to form the semiconductor device to have a portion having resistance identical with the resistance or to be a multiple of the resistance of the sensing portion R1 due to the development of semiconductor to design and fabrication technology.

To this end, the detecting portion 220 includes a first common mode current supplying portion 221, a second common mode current supplying portion 222, a first current mirror 223, and a second current mirror 224, as shown in FIG. 11A. The first common mode current supplying portion 220 provides a current 2Io which is twice of the current Io that flows in the sensing portion R1 when the resistance of the sensing portion 3 is the initial resistance before input of the photons.

The current flowing from a node A to the first current mirror 223 is identical with the current of the sensing portion R1, and thus the current flowing from the node A to the second current mirror is Io–Is. In this case, the node A is the simplest example of a current subtraction circuit that subtracts a current. However, the present invention is not limited to the above-described circuit.

The second common mode current supplying portion 222 provides a current Io of when the resistance is the initial value before input of the photons. Since the current input from a node B to the second current mirror 224 is identical with the current from a node A to the second current mirror 224, the current flows from the node B to the CIS scanning portion 230 becomes a current Is corresponding to the varied resistance of the sensing portion R1. In this case, the node B is the simplest example of a current subtraction circuit that subtracts a current. However, the present invention is not limited to the above-described circuit.

According to another exemplary embodiment, the detecting portion 220 can be simplified to include one common mode current supplying portion 225 and one current mirror 226 as shown in FIG. 11B. The common mode current supplying portion 225 provides a current Io to the sensing portion R1. The current Io is the current of when the resistance of the sensing portion R1 is the initial resistance before input of the photons. Since the current mirror 226 enables the current having the same amount of current which flows in the sensing portion R1 to flow from a node C to the current mirror 226, a current Is to flow from the node C to the CIS scanning portion 230 corresponds to the changed resistance of the sensing portion R1. Both the node C connecting the common mode current supplying portion 225 to the current mirror 226 and the current mirror 226 are current subtraction circuits. In this case, the node C is the simplest example of a current subtraction circuit which subtracts a current. However, the present invention is not limited to the above-described circuit. While the embodiment is illustrated in FIG. 11A has a rather complicated structure, the circuit in this embodiment has an advantage in that a positive (+) sensing current is output.

Figure 12:
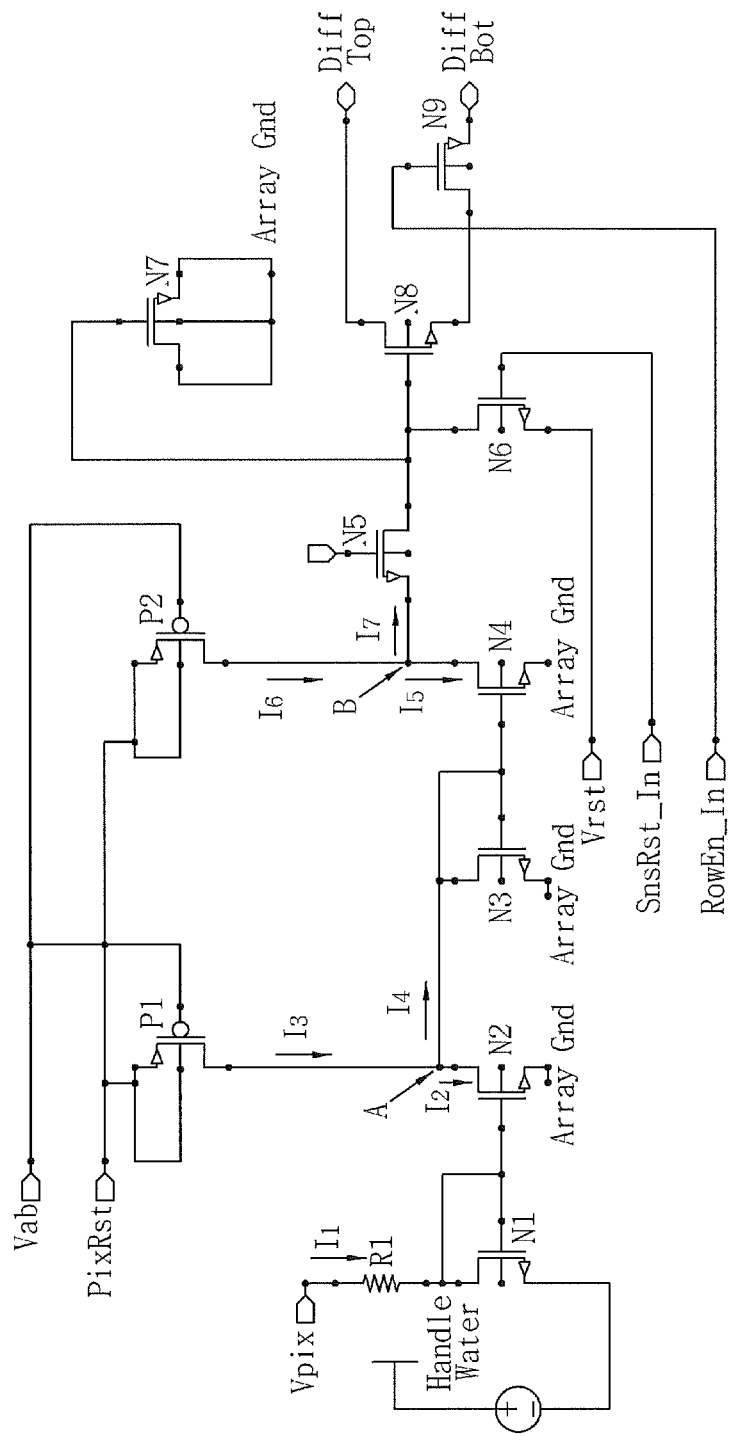
FIG. 12 is a circuit diagram of a detailed circuit structure of a pixel in an infrared sensor according to an exemplary embodiment.

FIG. 12 is a circuit diagram of a detailed circuit structure of a driving circuit for a pixel in an infrared sensor according to an exemplary embodiment.

A sensing portion R1 is a thermal sensor with nitride covering as the thermal absorber material. It is important to note that an N-channel metal-oxide semiconductor (NMOS) N1 is connected as a diode and a drain of the NMOS N1 will not vary far from Vth.

Referring to FIG. 10 again, the detecting portion 220 in the sensing circuit 200 in accordance with the exemplary embodiment includes NMOS transistors N1, N2, N3, and N4, and PMOS transistors P1 and P2, and the output portion 230 (or CIS scanning portion in FIG. 11B) includes NMOS transistors N5, N6, N7, N8, and N9. The circuit structure of FIG. 12 corresponds to the circuit structure of FIG. 11A. A copied current I7 of the current according to the resistance changed by the infrared radiation of the sensing portion R1 flows in a node B between the PMOS transistor P2 and the NMOS transistor N4.

The first common mode current supplying portion 221 and the second common mode current supplying portion 222 correspond respectively to the PMOS transistor P1 and PMOS transistor P2, each of which is driven by a voltage Vab. The voltage Vab is a bias voltage for constant current to flow into each of the PMOS transistors P1 and P2.

The sensing circuit 200 in accordance with the exemplary embodiment operates in sensing, readout, and reset modes. The sensing circuit 200 receives IR radiation and generates variable current in the sensing mode, the sensing circuit 200 reads out the varied current in the readout mode, and the sensing circuit 200 resets the heat radiated by the sensing portion R1.

During the sensing period, Vpix is set to about 0 volt, and the other signals do not operate, and the heat is collected in the resistor R1.

During the readout period, Vpix is set to about 2 volts, and a certain amount of current flows in the resistor R1 according to the resistance dependant upon temperature.

To reset the sensor, in other words, to deflect the sensor such that it contacts the handle wafer and dumps its heat, Vpix is driven to about 0 volts and a large voltage of approximately 4 volts may be applied to the handle wafer. No other signals are activated. When the reset voltage is applied, the resistor R1 deflects to contact the handle wafer and is thermally reset. It is important that each end of the resistor, to which the reset voltage is applied, stays around the 0 ~range to ensure operation of the MEMS structure.

Hereinafter, the circuit operation during the readout period will now be described.

In FIG. 12, the MNOS transistor N1 and the NMOS transistor N2 are circuits corresponding to the first current mirror 223 in FIG. 11A. Therefore, the current I2 flowing into a drain of the transistor N2 is the same as the current Io, and when the resistance is changed by the infrared radiation, the current becomes Io+Is.

The current I3 flowing into the PMOS transistor P1 is twice of the current Io due to the bias voltage Vab. Hence, the current I4 flowing out of the node A is Io–Is.

The NMOS transistor N3 and the NMOS transistor N4 correspond to the second current mirror 224 in FIG. 11A. Hence, the current I5 flowing into a drain of the NMOS transistor N4 is Io–Is, which is the same as the current I4. Due to the bias voltage Vab, the current I6 flowing out of the drain of the PMOS transistor P2 is Io. Therefore, the current I7 flowing out of the node B becomes Is.

The transistor configuration of the detecting portion 220 may be simplified such that it corresponds to the circuit configuration illustrated in FIG. 11B. In this case, the PMOS transistor P1 and the NMOS transistors N2 and N3 can be removed from the original circuit, and a gate of the NMOS transistor N1 is connected to a gate of the NMOS transistor N4.

The NMOS transistors N5, N6, N8, and N9 respectively correspond to a transfer transistor, a reset transistor, a driving transistor, and a selection transistor in a CMOS image sensor structure. The NMOS transistor N7 acts as a capacitor which is optimized for conversion of the current I7 into a voltage on the gate capacitance of the NMOS transistor N7.

The NMOS transistor N5 is a transfer transistor for selectively transferring the amount of electric charges from the node B to the capacitor N7. The NMOS transistor N6 can reset the electric charges charged in the capacitor N7, and the NMOS transistor N8 drives a source end in response to the voltage from the capacitor N7. The NMOS transistor N9 selectively outputs the driven outputs.

The capacitor N7 is set to a particular voltage by the NMOS transistor N6 which is controlled by a driving voltage SnsRst_In. The current I7 is transferred to the capacitor by the driving of the gate voltage of the transfer transistor N5 for the amount of electric charges to be added or subtracted from the capacitor N7. The NMOS transistor N6 is used to pre-bias the sense node to various voltages to optimize the operation of the sensor. The transfer transistor N5 connecting to the sensing portion RI allows the shutter action of the array.

When the integration is finished which is the infrared radiation period, the amount of the electric charges of the capacitor N7 is obtained by subtracting Tint (integration period)*I7 from the initial amount of the electric charges, and the current is converted into the voltage in the capacitor N7 and the converted value is stored. When a gate voltage RowEn_In is applied to the selection transistor N9, the voltage stored in the capacitor N7 is output as an output voltage (Difftop).

A double read operation including resetting, reading, charging and reading, such as a correlated double sampling (CDS) may be performed in the circuit described above to remove offsets across the array.

The transfer transistor N9 is used to enable the readout transistors onto a column circuit to read out the array one row at a time. The sensor operates identically to the operation of a CIS due to the fact that one sample is the read out per operation of the capacitor N7.

The circuit of FIG. 12 is a sensing circuit of a pixel. In a pixel array formed of multiple pixels, the output voltage is read out and stored in each row, and the readout voltage passes through an output amplifier (not shown), undergoing the an image signal processing, and is output.

The pixel array circuit should read the parametric shift of the sensor. Therefore, the readout should be performed across the whole pixel array simultaneously to provide global shutter action. Furthermore, the common mode signal subtraction can be ideally accomplished in the pixel to provide higher performance.

Hereinabove, a method of reading out a signal based on thermal changes in the resistance by eliminating a common mode current from an internal circuit of a pixel sensor has been described, and hereinafter a method of eliminating a common mode signal in circuit external to the pixel array will be described.

As described above, in bolometric sensing, received IR radiation causes a parametric shift in a resistance characteristic of the sensor, and the parametric shift is due to the temperature coefficient of resistance (TCR), whereby the resistance changes with changing temperature of a sensing area. This change in resistance has to be converted into a signal that is representative of incoming energy. Hereinafter, for convenience, a signal that is read out by a pixel sensor is represented as a voltage.

Where a probe current measured by the sensing portion 3 of FIG. 10 is represented by $i_b$, and TCR is represented by $\alpha$, a resistance of a sensor is represented by R, and a change in temperature of the sensor is represented by $\Delta T$, a corresponding voltage $V_s$ can be calculated by Equation 6 below.

$$V_s = i_b \alpha R \Delta T \qquad \text{[Equation 6]}$$

The primary challenge in designing a readout circuitry is the presence of a very high common mode (CM) signal due to the resistance R of the sensor. To increase the amplitude of a desired signal $V_s$, a higher value of resistance R is required, but a higher value of resistance R also produces a higher common mode voltage $V_{cm}$ when the probe current interacts with the resistance R of the sensor.

The common mode voltage $V_{cm}$ can be represented by Equation 7 below.

$$V_{cm} = i_b R \qquad \text{[Equation 7]}$$

In Equation 7, there is no contribution from the incident thermal energy. This common mode voltage $V_{cm}$ has to be subtracted in a voltage $V_o$ which detected after heat accumulation during the integration period.

A readout circuit in a bolometer contends with the very high common signal present. Depending upon the material used in the sensor and the TRC of that material, a thermal signal $V_s$ to the common mode signal $V_{cm}$ ratio may be only a few percent to a few fractional percent, a few parts per hundred to a few parts per thousand.

In semiconductor design there are two principal contributing factors that will lead to poor image quality that arise in the readout circuitry of the bolometer; they are noise in the circuit and mismatch between pixel circuits in a pixel array. It is well known that as transistors are made smaller in a design both noise and mismatch increase. Given that there is limited area under each sensing element in a sensor, any increase in circuit complexity has a concomitant increase in contributed noise and mismatch in the final image because of the decreased transistor size.

One form of mismatch arises in Threshold voltage offset of the transistor in a pixel (which manifests itself as amplifier offset), in which slight DC shifts in the operating point of the amplifiers that are random across the chip design. There are other forms of mismatch and this is illustrative only. Particularly, in the readout circuit in a bolometer, since each pixel area is limited, circuit complexity increases, and a transistor area decreases while noise and mismatch increase.

One technique that is used to eliminate the mismatch is to ensure that there are as few amplifiers in the signal chain as possible. According to the exemplary embodiment, the common mode signals and the sensed signals both transit the same circuitry, thereby eliminating the amplifier offset once they are subtracted.

The objective of designing a sensing circuit in accordance with the exemplary embodiment is to obtain a sensor that has much higher performance than standard bolometers by reducing circuit complexity, providing an immediate reference that transit the same signal chain and subtracting the two samples $[V_{cm} - (V_{cm} + V_s)]$ digitally. This design in turn allows using material (Si in this case) that has lower TCR, thereby rendering it more compatible with CMOS processes. Additionally, using single-crystalline Si also renders a sensor material that has very low noise and in particular 1/f noise. A single-crystalline Si based TCR material will have a SNR (Signal to Noise Ratio) more than an order of magnitude higher than VOx based bolometers but it cannot be used with traditional readout circuits, as the TCR is lower than VOx and the noise and artifact levels in those circuits would adversely affect the signal. However, in one embodiment, single-crystalline Si may be used as a bolometer material.

Figure 13:
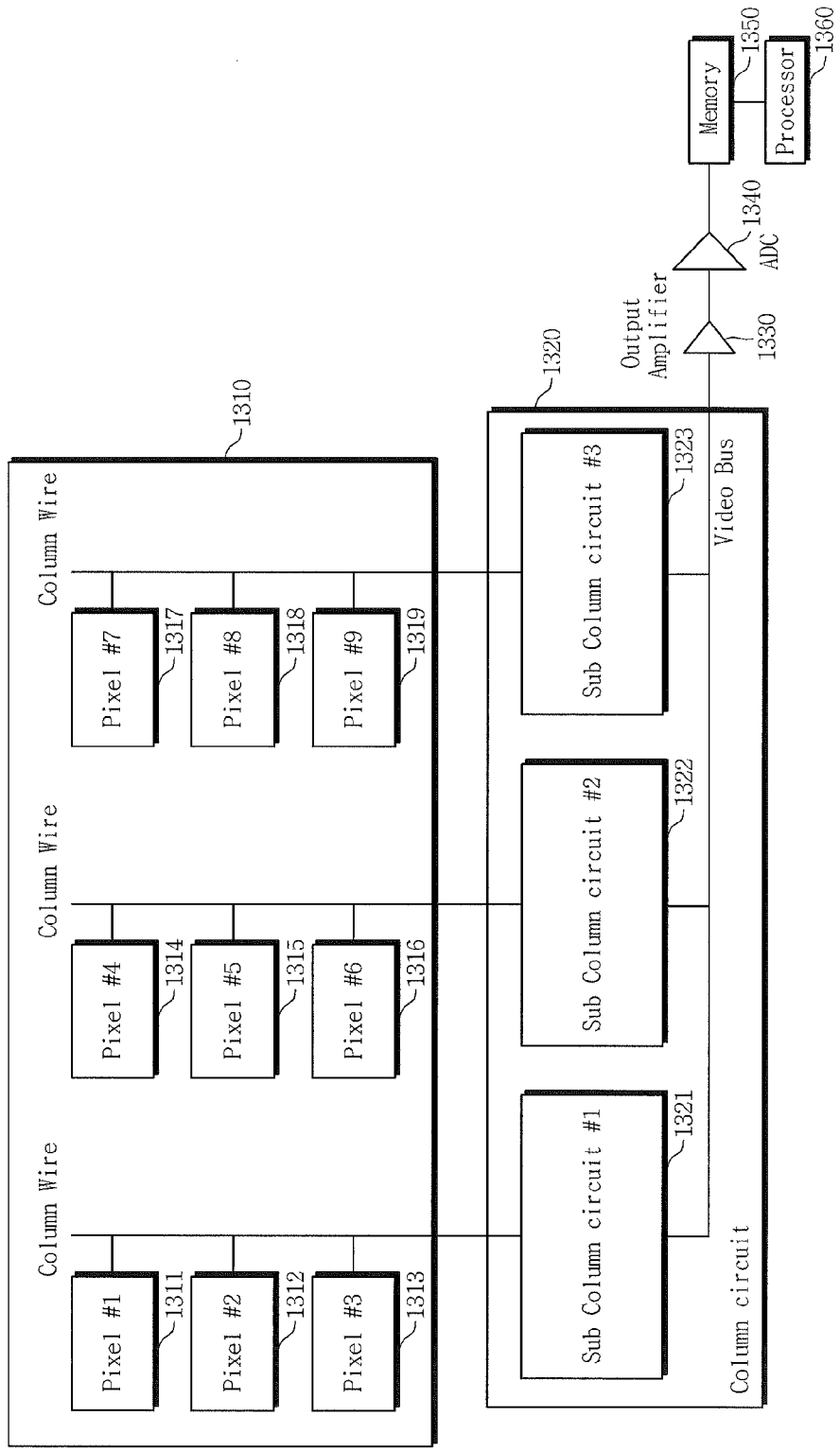
FIG. 13 is a block diagram of a bolometer sensing circuit according to an exemplary embodiment.

FIG. 13 is a block diagram of a bolometer sensing circuit according to an exemplary embodiment.

The bolometer sensing circuit 1300 may include a pixel array 1310, a column circuit 1320, an output amplifier 1330, an analog to digital (ADC) 1340, a memory 1350, and a processor 1360.

The pixel array 1310 includes a plurality of pixels. Although in FIG. 13 a 3×3 pixel array is illustrated, the number of pixels in a pixel array is not limited. A driving signal is applied to each pixel. The pixels 1311, 1322, 1313, 1314, 1315, 1316, 1317, 1318, and 1319 have the same configuration.

The column circuit 1320 reads out a signal from the pixel array 1310. The column circuit 1320 may be configured to decode address signals along a column direction according to a rolling-shutter system, and output the read-out signals sequentially. Alternatively, the column circuit 1320 may be configured to concurrently read out and output signals from the pixel array according to a global shutter system.

The column circuit 1320 may have sub-column circuits 1321, 1322, and 1323, each disposed for each column of pixels. Each of the sub-column circuits 1321, 1322, and 1323 may include a storage (not illustrated) to temporarily store a signal read out by each pixel in the pixel array 1310. The signal present the storage of each sub-column circuit 1321, 1322, and 1323 is output to the output amplifier 1330 along a video bus.

The output amplifier 1330 drives the ADC 1340 to produce a digital value (or a binary value) based on an input signal. The digital value is stored in the memory 1350.

The memory 1350 may be configured to store digital values corresponding to locations of pixels in the pixel array 1310 to obtain a final image. The memory 1350 may store a common mode voltage and a sensed voltage, respectively.

The processor 1360 may subtract the common mode voltage $V_{cm}$ from the sensed voltage ($V_o = V_{cm} + V_s$) to yield a signal voltage ($-V_s$). A signal voltage value generated with respect to each pixel in the pixel array 1310 may be converted into an image frame. In addition, the processor 1360 may be configured to provide various driving signals, for example, a driving signal for a transistor in a pixel and a switching control signal (SC).

Moreover, the memory 1350 may be configured to store a digital value produced from a signal sensed by each image frame.

Although in FIG. 13, the ADC 1340 is illustrated as being separate from the column circuit 1320, the ADC 1340 may be included in each of the sub-column circuit 1321, 1322, and is 1323 of the column circuit 1320. The memory 1350 may be located externally to the bolometer sensing circuit 1300. Since the ADC 1340, the memory 1350, and the processor 1360 are disposed externally to the pixel array 1360 as shown in FIG. 13, there is no pixel size constraint and process for matching and noise reduction can be performed in much easier manner, compared to the case where the ADC 1340, the memory 1350 and the processor 1360 are placed within the pixel array 1310 or the column circuit 1320.

According to the rolling shutter system, an integration period refers to duration of time for which a sensing portion (reference numeral 3 in FIG. 10) is reset one row at a time and then subsequently a sensed signal is read out a fixed period of time later. In the rolling shutter system, the pixels (for example, pixel #1 1311, pixel #4 1314, and pixel #7 1317) of a row may have the same integration time, but offset occurs in pixels in the neighboring row during the integration period.

As such, according to the present invention, the common mode voltage $V_{cm}$ and the sensed voltage $V_o$ are read out at each location of the pixel array 1310, undergo the same readout process in each pixel, and then are stored in the memory 1350 via the same column circuit 1320 and the ADC 1340, and thus are subjected to the same offsets and mismatches until being stored in the memory 1350. Hence, it is advantageous in that a problem is prevented, which may be caused by a difference in signals between the common mode voltage $V_{cm}$ and the sensed voltage $V_o$ due to different amplifier offset and mismatches.

Figure 14:
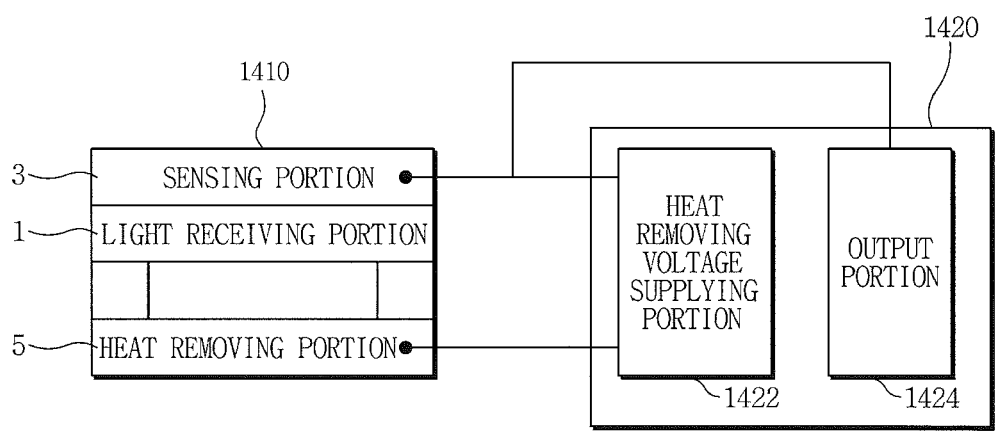
FIG. 14 is a block diagram of a structure of a pixel according to an exemplary embodiment.

FIG. 14 is a block diagram of a structure of a pixel according to an exemplary embodiment.

One pixel, for example, pixel #1 1311, may be formed the same as the pixel 1400 shown in FIG. 14.

The pixel 1400 may include a sensor configuration 1410 and a sensing circuit 1420. The sensor configuration 1410 may include a light receiving portion 1, a sensing portion 3, and a heat removing portion 5. The light receiving portion 1 converts incident photons into heat, and the sensing portion 3 is integrated with the light receiving portion 1 and has resistance varying with the converted heat. The sensor configuration 1410 has the same structure as the sensor configuration 100 of FIG. 10. The sensing portion 3 may be single-crystalline silicon thin film.

The heat removing portion 5, for example, a handle wafer, is applied a heat removing voltage by a heat removing voltage supplying portion 1422, and accordingly, the light receiving portion 1 and the sensing portion 3 are in contact with the heat removing portion 5 due to electrostatic attraction force, thereby removing accumulated heat from the sensing portion 3.

The sensing circuit 1420 may include the heat removing voltage supplying portion 1422 and an output portion 1424. The output portion 1424 outputs a common mode voltage $V_{cm}$ that represents a voltage of the sensing portion 3 from which accumulated heat has been removed by an applied heat removing voltage that thermally resets the sensing portion 3, and outputs a sensed voltage $V_o$ that represents a voltage of the sensing portion 3 which has accumulated heat during an integration period after being thermally reset. The sensed voltage $V_o$ contains the common mode voltage $V_{cm}$ and a signal voltage $V_s$ that is actually measured.

As the common mode voltage $V_{cm}$ and the sensed voltage $V_o$ are sequentially output from the output portion 1424, the memory 1350 of FIG. 13 stores the common voltage mode $V_{cm}$ and the sensed voltage $V_o$ accordingly. In addition, the processor 1360 subtracts the common mode voltage $V_{cm}$ from the sensed voltage $V_o$ to produce a signal voltage $V_s$. The signal voltage $V_s$ indicates the resistance change of the sensing portion 3 due to heat accumulated during the integration period.

Figure 15:
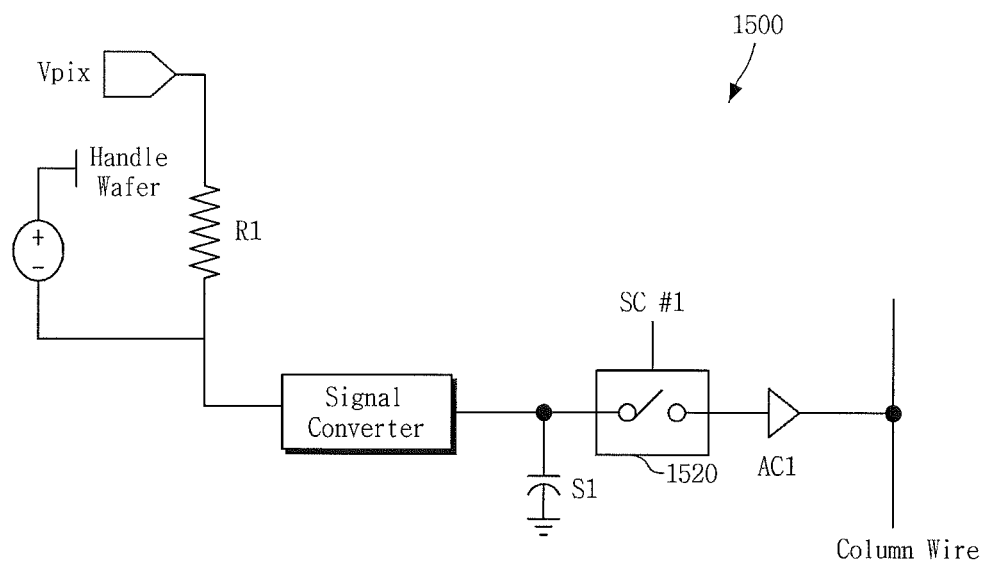
FIG. 15 is a circuit diagram of a detailed circuit structure of the pixel shown in FIG. 14 according to an exemplary embodiment.

FIG. 15 is a circuit diagram of a detailed circuit structure of the pixel shown in FIG. 14 according to an exemplary embodiment.

Referring to FIG. 15, a pixel 1500 may include a resistor R1, a signal converter 1510, switch #1 1520, a single storage S1, and an amplifier Ac1.

The resistor R1 corresponds to the sensing portion 3 of FIG. 14 that has resistance varying with heat. The signal converter 1510, the switch #1 1520, the single storage S1 and the amplifier Ac1 correspond to the output portion 1424 of FIG. 14.

The signal converter 1510 is a circuit that converts a value of the resistor R1 into a transferable signal. For example, the signal converter 1510 may be implemented as a transfer transistor, such as the NMOS transistor N5 in FIG. 12, to transfer the value detected by the resistor R1 to the storage S1 in response to an external control signal.

The storage S1 may be a capacitor. The storage S1 may be implemented as the same capacitor as the NMOS transistor N7 of FIG. 12.

The switch #1 1520 may transfer the signal present in the storage S1 to the column circuit 1320 of FIG. 13 via a column wire. The switch #1 1520 may be controlled by a switch control signal SC1. The signal output according to the switch #1 1520 may be selectively amplified by the amplifier Ac1 and then transferred via the column wire.

To obtain a final image value corresponding to a sensed signal which has a common mode signal removed therefrom, one scan period that each pixel takes to output the common mode voltage and the sensed voltage may include a first period before common mode voltage (or a reset voltage) is read out and a second period after common mode voltage is read out. Heat may be accumulated in the resistor R1 during the common mode voltage is read out.

The storage S1 may store the common mode voltage of the resistor R1 during the first period and store the sensed voltage of the resistor R1 during the second period.

To this end, the switch #1 5120 may output the common mode voltage to the memory 1350 after the first period, and output the sensed voltage to the memory 1350 subsequently after the second period. An operation sequence is required to be controlled such that the sensed voltage cannot be stored in the storage S1 until the common mode voltage is output from the storage S1. In addition, since the common mode voltage and the sensed voltage are sequentially stored in the single storage S1 and sequentially output from the single storage S1 for one scan period, high-speed pixel control is required.

Figure 16:
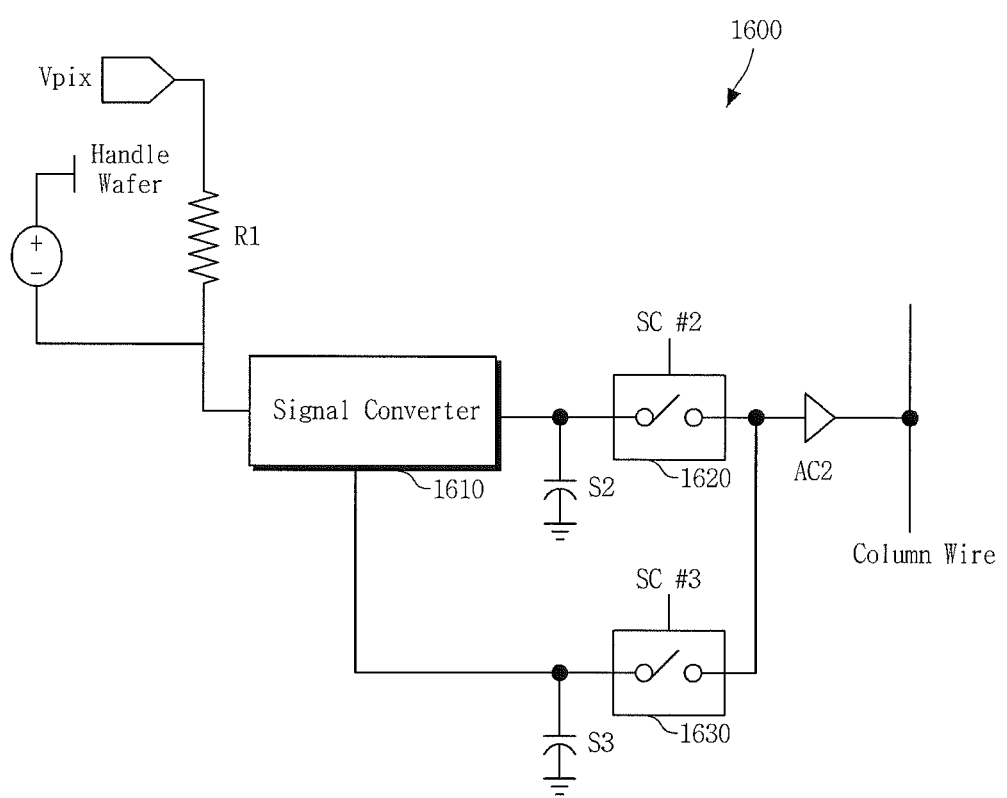
FIG. 16 is a circuit diagram of a detailed circuit structure of the pixel shown in FIG. 14 according to another exemplary embodiment.

FIG. 16 is a circuit diagram of a detailed circuit structure of the pixel shown in FIG. 14 according to another exemplary embodiment.

Referring to FIG. 16, the pixel 1600 may include a resistor R1, a signal converter 1610, switch #2 1620, a first storage S2, switch #3 1630, a second storage S3, and an amplifier Ac2. The pixel 1600, unlike the pixel 1500 of FIG. 15, includes two storages and two switches. The signal converter 1610, the switch #2 1620, the first storage S2, the switch #3 1630, the second storage S3, and the amplifier Ac2 correspond to the output portion 1424 of FIG. 14.

The resistor R1, the signal converter 1620, and the amplifier Ac2 have the same structures of their respective counterparts of FIG. 15.

Each of the first storage S1 and the second storage S3 may be implemented as a capacitor.

The first storage S2 stores the common mode voltage of the resistor R1. The switch #2 1620 transfers a signal stored in the first storage S2 to the column circuit 1320 of FIG. 13 via the column wire. The switch #2 1620 may be controlled by a switch control signal SC2. The signal output by the switch #2 1620 is selectively amplified by the amplifier Ac2 and then transferred via the column wire.

The second storage S3 stores a sense voltage of the resistor R1. The switch #3 1630 transfers the signal stored in the second storage S2 to the column circuit 1320 of FIG. 13 via the column wire. The signal output by the switch #3 1630 may be selectively amplified by the amplifier Ac2 and then transferred via the next column wire.

As such, the two storages which respectively store the common mode voltage and the sensed voltage contribute to change in pixel readout sequence, whereby the sensed voltage can is be read out first from the second storage S3 before the common voltage mode is read out from the first storage S2. Thus, the pixel readout sequence of the circuit structure illustrated in FIG. 16 may be less restricted than the pixel readout sequence of FIG. 14.

By not using the second storage S3 and the switch #3, the pixel 1600 of FIG. 16 can operate in the same manner as the pixel of FIG. 15 equipped with the single storage.

The pixel shown in FIG. 14 may have storages more than two, because there are certain situations in which a third storage node is required for fully unrestricted operation/sequencing.

Figure 17:
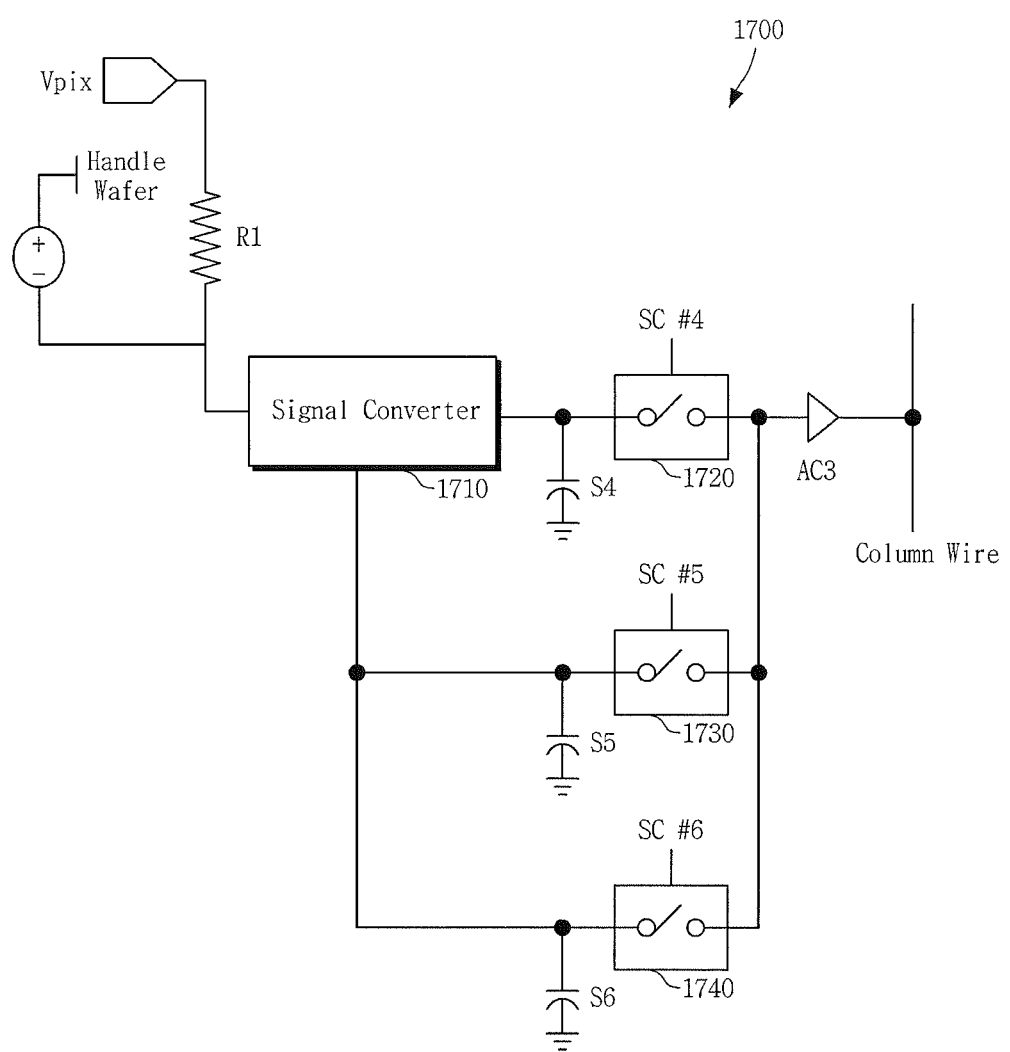
FIG. 17 is a circuit diagram of a detailed circuit structure of the pixel shown in FIG. 14 according to yet another exemplary embodiment.

FIG. 17 is a circuit diagram of a detailed circuit structure of the pixel shown in FIG. 14 according to yet another exemplary embodiment.

Referring to FIG. 17, a pixel 1700 includes a resistor R1, a signal converter 1610, a switch #4 1720, a first storage S4, switch #5 1730, a second storage S5, switch #6 1740, a third storage S6, and an amplifier AC3. For example, the pixel #1 1700, unlike the pixel 1500 illustrated in FIG. 15, may include three storages and three switches.

The resistor R1, the signal converter 1710, and the amplifier AC3 may have the same structures as their respective counterparts of FIG. 15.

Each of the first, second, and third storages S4, S5, and S6 may be implemented as a capacitor.

The first storage S4 may store a common mode voltage of the resistor R1. The switch #4 1720 may transfer a signal present in the first storage S4 to the column circuit 1320 illustrated in FIG. 13 via a column wire. The switch #4 1720 may be controlled by a switch control signal SC4. A signal that is output via the switch #4 1720 may be selectively amplified by the amplifier AC3, and the amplified signal may be transmitted via the column wire.

The second storage S5 may store a sensed voltage of the resistor R1. The switch #5 1730 may transmit a signal present in the second storage S5 to the column circuit 1320 illustrated in FIG. 13 via the column wire. The switch #5 1730 may be controlled by a switch control is signal SC5. The signal that is output via the switch #5 1730 may be selectively amplified by the amplifier AC3, and the amplified signal may be transmitted via the column wire.

The third storage S6 may store a common mode voltage or a sensed voltage according to a control sequence to control the pixel 1700. For example, the common mode voltage or the sensed voltage stored in the third storage S6 may be a pixel value, such as a common mode voltage or a sensed voltage of a temporal adjacent frame of a current frame. The switch #6 1740 may transmit a signal present in the third storage S6 to the column circuit 1320 illustrated in FIG. 13 via the column wire. The switch #6 1740 may be controlled by a switch control signal SC6. The signal that is output via the switch #6 1740 may be selectively amplified by the amplifier AC3, and the amplified signal may be transmitted via the column wire.

By not using the second storage S5, the fifth switch 1730, the third storage S6, and the switch #6 1740, the first pixel 1700 may operate in the same manner as a pixel equipped with a single storage as illustrated in FIG. 15.

There is the opportunity to apply a rough $V_{cm}$ subtraction within the pixel circuitry, and then to amplify the resulting signal in a circuit block before the ADC. Here, the rough $V_{cm}$ means a globally referenced signal $V_G$ that is distributed to every pixel of the pixel array 1310. The globally referenced signal is related to a value of a current which is flowing in the sensing portion when there is no incident light means. The subtraction of the globally referenced signal from the sensed voltage $V_o$ cannot fully remove the $V_{cm}$ in every pixel because of the variation in $V_{cm}$ across the array. However, the magnitude of $V_G$ can be large enough to ensure that a large proportion of $V_{cm}$ is removed in all pixels. The criteria for the size of $V_G$ is that it cannot be so large that any of the pixels are clipped or cut off by subsequent processing i.e. made negative after subtraction. To subtract the global voltage $V_G$ from the sensed voltage $V_o$, each pixel of the pixel array may utilize a circuit modified from one of the examples illustrated in FIGS. 10 to 12.

Specifically, the common mode current Io may output a global current that is commonly distributed to every pixel of the pixel array comprising the semiconductor. The first common mode current supplying portion 221 of FIG. 11A may output a globally referenced current having a size corresponding to a multiple of the globally referenced current and the second common mode current providing portion 222 of FIG. 11A may output a globally referenced current having a size corresponding to an output value from the first common mode current providing portion 221. The common mode current providing portion 225 of FIG. 11B may output the globally referenced current. By this configuration, the first common mode current supplying portion 221 of FIG. 11A, the second common mode current providing portion 222 of FIG. 11A and the common mode current providing portion 225 of FIG. 11B are enabled to obtain a signal close to a desired signal current Is that is caused by a change in resistance ΔR, without being required to be configured to provide an accurate reference value (i.e., a common mode current) corresponding to a value of a current which is flowing in the sensing portion when there is no incident light.

This has the advantage of allowing every pixel's sampled value of both reset and signal states, i.e. the common mode voltage and the sensed voltage, to transit the same signal block and thus have any systemic errors reduced by downstream signal processing in the digital domain, principally by the subtraction operation. Because the circuits to read out the common mode voltage and the sensed voltage is external to the pixel array, the effects of size constraints such as noise and matching considerations are greatly reduced.

According to a configuration of a semiconductor device in accordance with an exemplary embodiment, only a sensing current is detected by a circuit that generates a common mode current so that subtle changes in electric current can be precisely identified to raise the sensitivity.

Also, the semiconductor device removes heat accumulated in a sensing portion mechanically under the control of an electric circuit, and thus the heat is removed easily and efficiently.

In addition, in the semiconductor device according to the exemplary embodiment, a circuit that removes accumulated heat is connected with a sensing circuit, thereby enabling the efficient circuit arrangement for the semiconductor device.

Moreover, according to a configuration of a semiconductor device in accordance with an exemplary embodiment, as crystalline silicon thin film formed by any methods such as a thin-film transfer is used for a sensing portion, the performance of the semiconductor device can be substantially improved thanks to a low noise characteristic of the single crystalline silicon.

In addition, according to the exemplary embodiment, single crystalline silicon by the use of a SOI method such as thin-film transfer is formed in a serpentine structure, and hence a high resistibility is achieved and the performance of the semiconductor is consequently enhanced.

Since an oxide layer directly below a sensing portion is easily etched in the course of removal of the oxide layer due to the serpentine structure, the fabrication efficiency of the semiconductor device can be improved.

Furthermore, according to an exemplary embodiment, since there is difference in a coefficient of thermal expansion between the light receiving portion and the sensing portion, the performance improvement of the semiconductor device can be achieved by additional increase in the resistance.

Moreover, according to an exemplary embodiment, a silicon on insulator (SOI) method enables the efficient use of single crystalline silicon of the semiconductor device.

Also, according to an exemplary embodiment, since accumulated heat is reset based on a MEMS-based reset structure, the performance of the sensing unit is not dependent upon the sensitivity, thereby enabling high-speed operation of the semiconductor device, remaining debris of a previous image is removed, and the sensitivity and operational speed are maximized.

Additionally, due to the MEMS-based reset structure, since transistors can be placed at a lower part of each of the light receiving portion and the sensing portion, there is not required an additional horizontal space for the semiconductor device.

Finally, according to an exemplary embodiment, elements required for a sensing circuit that detects a voltage corresponding to the resistance of the sensing unit, which changes according to accumulated heat are fabricated by use of the CMOS fabrication method, and thus the semiconductor device can be manufactured efficiently.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A bolometric sensing circuit comprising:
a pixel array comprising of a plurality of pixels, each pixel comprising of a sensor configured of a light receiving portion to convert incident photons into heat and a sensing portion integrated with the light receiving portion and having a resistance varying according to the converted heat, a mechanical structure that moves in response to an applied voltage that pulls the sensing area into intimate contact with a thermal sink such that the temperature of the sensor is equalized with the substrate, thereby thermally resetting the sensor;
an output portion configured to output a common mode voltage that represents a voltage derived from the sensing portion from which accumulated heat has been removed in response to a heat removing voltage actuated mechanical thermal reset of the sensing portion, and an output of a sensed voltage that represents a voltage of the sensing portion which has accumulated heat for an integration period after being thermally reset;
a memory configured to store the common mode voltage and the sensed voltage; and
a processor configured to subtract the common mode voltage from the sensed voltage to produce a signal representation that represents a change in resistance of the sensing portion due to the heat accumulated for the integration period,
wherein a read out of the common mode voltage and the sensed voltage occurs during one scan period in which desired number of pixels are read out, the one scan period includes a first period before the common mode voltage is read out and a second period after the common mode voltage is read out, and
the output portion is further configured to comprise:
a storage configured to store the common mode voltage for the first period and to store the sensed voltage for the second period; and
a switching portion configured to output the common mode voltage to the memory after the first period and subsequently output the sensed voltage after the second period.

2. The bolometric sensing circuit of claim 1, wherein the output portion is further configured to comprise:
a first storage configured to store the common mode voltage;
a second storage configured to store the sensed voltage;
a first switching portion configured to output the common mode voltage to the memory; and
a second switching portion configured to output the sensed voltage to the memory.

3. The bolometric sensing circuit of claim 1, wherein the output portion is further configured to comprise:
a first storage configured to store the common mode voltage;

a second storage configured to store the sensed voltage;

a third storage configured to store a common mode voltage or a sensed voltage of a temporal adjacent frame of a current frame;

a first switching portion configured to output the common mode voltage to the memory;

a second switching portion configured to output the sensed voltage to the memory; and a third switching portion configured to output the common mode or sensed voltage present in the third storage.

4. The bolometric sensing circuit of claim 1, wherein the sensing portion is a single-crystalline silicon thin film.

5. The bolometric sensing circuit of claim 1, wherein the processor supplies a control signal to the switching portion for control.

* * * * *